(12) United States Patent
Chang et al.

(10) Patent No.: US 9,728,457 B2
(45) Date of Patent: Aug. 8, 2017

(54) SYSTEM, STRUCTURE, AND METHOD OF MANUFACTURING A SEMICONDUCTOR SUBSTRATE STACK

(71) Applicant: Taiwan Semiconductor Manufacturing Company, Ltd., Hsin-Chu (TW)

(72) Inventors: Hung-Pin Chang, Taipei (TW); Weng-Jin Wu, Hsin-Chu (TW); Wen-Chih Chiou, Zhunan Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/507,467

(22) Filed: Oct. 6, 2014

(65) Prior Publication Data

US 2015/0024546 A1 Jan. 22, 2015

Related U.S. Application Data

(62) Division of application No. 12/178,021, filed on Jul. 23, 2008, now Pat. No. 8,853,830.

(60) Provisional application No. 61/127,627, filed on May 14, 2008.

(51) Int. Cl.
| | |
|---|---|
| *H01L 21/768* | (2006.01) |
| *H01L 25/00* | (2006.01) |
| *H01L 23/48* | (2006.01) |
| *H01L 25/065* | (2006.01) |

(52) U.S. Cl.
CPC ...... *H01L 21/76898* (2013.01); *H01L 21/768* (2013.01); *H01L 21/7684* (2013.01); *H01L 21/76877* (2013.01); *H01L 23/481* (2013.01); *H01L 25/0657* (2013.01); *H01L 25/50* (2013.01); *H01L 2225/06513* (2013.01);
(Continued)

(58) Field of Classification Search
CPC .................................................... H01L 21/304
USPC ...................................................... 438/977
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,627,106 A | 5/1997 | Hsu |

(Continued)

FOREIGN PATENT DOCUMENTS

| | | |
|---|---|---|
| CN | 1858908 A | 11/2006 |
| CN | 1858909 A | 11/2006 |

(Continued)

*Primary Examiner* — Robert Carpenter
(74) *Attorney, Agent, or Firm* — Slater Matsil, LLP

(57) ABSTRACT

A method of manufacturing a semiconductor substrate structure for use in a semiconductor substrate stack system is presented. The method includes a semiconductor substrate which includes a front-face, a backside, a bulk layer, an interconnect layer that includes a plurality of inter-metal dielectric layers sandwiched between conductive layers, a contact layer that is between the bulk layer and the interconnect layer, and a TSV structure commencing between the bulk layer and the contact layer and terminating at the backside of the substrate. The TSV structure is electrically coupled to the interconnect layer and the TSV structure is electrically coupled to a bonding pad on the backside.

21 Claims, 6 Drawing Sheets

(52) U.S. Cl.
CPC .............. *H01L 2225/06541* (2013.01); *H01L 2924/0002* (2013.01)

(56) References Cited

U.S. PATENT DOCUMENTS

| | | | |
|---|---|---|---|
| 5,640,049 A | 6/1997 | Rostoker et al. | |
| 5,756,395 A | 5/1998 | Rostoker et al. | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,187,677 B1 | 2/2001 | Ahn | |
| 6,239,495 B1 | 5/2001 | Sakui et al. | |
| 6,322,903 B1 | 11/2001 | Siniaguine et al. | |
| 6,355,950 B1 | 3/2002 | Livengood et al. | |
| 6,426,288 B1 | 7/2002 | Meikle | |
| 6,448,168 B1 | 9/2002 | Rao et al. | |
| 6,465,892 B1 | 10/2002 | Suga | |
| 6,472,293 B1 | 10/2002 | Suga | |
| 6,495,454 B2 | 12/2002 | Livengood et al. | |
| 6,538,333 B2 | 3/2003 | Kong | |
| 6,583,045 B1 | 6/2003 | Liu et al. | |
| 6,599,778 B2 | 7/2003 | Pogge et al. | |
| 6,639,303 B2 | 10/2003 | Siniaguine | |
| 6,642,081 B1 | 11/2003 | Patti | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,809,421 B1 | 10/2004 | Hayasaka et al. | |
| 6,818,931 B2 | 11/2004 | Liu et al. | |
| 6,841,469 B2 | 1/2005 | Sawada et al. | |
| 6,841,883 B1 | 1/2005 | Farnworth et al. | |
| 6,882,030 B2 | 4/2005 | Siniaguine | |
| 6,897,125 B2 | 5/2005 | Morrow et al. | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,276,787 B2 | 10/2007 | Edelstein et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,365,418 B2 | 4/2008 | Hsu | |
| 7,402,515 B2 | 7/2008 | Arana et al. | |
| 7,466,028 B1 | 12/2008 | Yu et al. | |
| 7,615,841 B2 | 11/2009 | Chen et al. | |
| 7,742,277 B2 | 6/2010 | Shinoda et al. | |
| 7,786,584 B2 | 8/2010 | Barth et al. | |
| 7,872,357 B2 | 1/2011 | Yu et al. | |
| 7,902,643 B2 | 3/2011 | Tuttle | |
| 7,939,941 B2 | 5/2011 | Chiou et al. | |
| 8,691,664 B2 | 4/2014 | Yang et al. | |
| 9,209,157 B2 | 12/2015 | Chiou et al. | |
| 2002/0048901 A1 | 4/2002 | Brouillette et al. | |
| 2002/0123299 A1 | 9/2002 | Chopra et al. | |
| 2002/0163072 A1 | 11/2002 | Gupta et al. | |
| 2002/0164839 A1 | 11/2002 | Enquist | |
| 2003/0064671 A1 | 4/2003 | Pasqualoni et al. | |
| 2003/0073601 A1 | 4/2003 | Small et al. | |
| 2003/0232488 A1 | 12/2003 | Chua et al. | |
| 2004/0198021 A1* | 10/2004 | Brouillette ........ H01L 21/76898 438/459 |
| 2005/0017333 A1 | 1/2005 | Bohr | |
| 2005/0042867 A1 | 2/2005 | Sanchez et al. | |
| 2005/0077630 A1 | 4/2005 | Kirby et al. | |
| 2005/0121768 A1 | 6/2005 | Edelstein et al. | |
| 2005/0139954 A1 | 6/2005 | Pyo | |
| 2005/0164490 A1 | 7/2005 | Morrow et al. | |
| 2006/0027934 A1 | 2/2006 | Edelstein et al. | |
| 2006/0057836 A1 | 3/2006 | Nagarajan et al. | |
| 2006/0121690 A1 | 6/2006 | Pogge et al. | |
| 2006/0151870 A1 | 7/2006 | Nishiyama et al. | |
| 2006/0281309 A1 | 12/2006 | Trezza | |
| 2007/0126041 A1 | 6/2007 | Shinoda et al. | |
| 2007/0190692 A1 | 8/2007 | Erturk et al. | |
| 2007/0216041 A1 | 9/2007 | Patti et al. | |
| 2007/0278619 A1 | 12/2007 | Clevenger et al. | |
| 2008/0018350 A1 | 1/2008 | Chao et al. | |
| 2008/0020488 A1 | 1/2008 | Clevenger et al. | |
| 2008/0073747 A1 | 3/2008 | Chao et al. | |
| 2008/0124845 A1 | 5/2008 | Yu et al. | |
| 2008/0142900 A1 | 6/2008 | Kim et al. | |
| 2008/0153187 A1 | 6/2008 | Luo et al. | |
| 2008/0206984 A1 | 8/2008 | Sparks et al. | |
| 2008/0220565 A1 | 9/2008 | Hsu et al. | |
| 2008/0233710 A1 | 9/2008 | Hsu et al. | |
| 2008/0237310 A1 | 10/2008 | Periaman et al. | |
| 2008/0265399 A1 | 10/2008 | Chao | |
| 2008/0268614 A1 | 10/2008 | Yang et al. | |
| 2008/0283871 A1 | 11/2008 | Hamada | |
| 2009/0001598 A1 | 1/2009 | Chiou et al. | |
| 2009/0008794 A1 | 1/2009 | Wu et al. | |
| 2009/0155624 A1 | 6/2009 | Dudesek et al. | |
| 2009/0224371 A1 | 9/2009 | Yu et al. | |
| 2009/0283871 A1 | 11/2009 | Chang et al. | |
| 2010/0090307 A1 | 4/2010 | Moriya et al. | |
| 2010/0267217 A1 | 10/2010 | Yang et al. | |
| 2011/0177655 A1 | 7/2011 | Chiou et al. | |

FOREIGN PATENT DOCUMENTS

| | | |
|---|---|---|
| JP | 2007250561 A | 9/2007 |
| TW | 424002 B | 3/2001 |
| WO | 2007023947 A1 | 3/2007 |

\* cited by examiner

SYSTEM, STRUCTURE, AND METHOD OF MANUFACTURING A SEMICONDUCTOR SUBSTRATE STACK

This application is a divisional of, and claims the benefit of, U.S. patent application Ser. No. 12/178,021, filed on Jul. 23, 2008, titled "System, Structure, and Method of Manufacturing a Semiconductor Substrate Stack," which claims the benefit of U.S. Provisional Application Ser. No. 61/127,627, filed on May 14, 2008, entitled "System, Structure, and Method of Manufacturing a Semiconductor Substrate Stack," which application is hereby incorporated herein by reference.

TECHNICAL FIELD

The present invention relates generally to a system, a structure, and a method of forming a semiconductor substrate stack, and particularly to forming a semiconductor substrate stack using a through substrate via (TSV).

BACKGROUND

As the cost of shrinking CMOS devices continues to increase, alternative approaches, such as extending the integration of circuits into the third dimension or semiconductor substrate stacking are being explored. Thinned substrates connected by TSVs can reduce the height and width of a packaged chip stack relative to current wire bonding technologies. Performance may also be enhanced because of TSV implementation in stacked chip designs.

Several methods of producing stacked substrates and TSVs have been implemented; including stacking wafers back-to-back, back-to-front, front-to-front, and chip stacking, for example. One known method of producing front-to-front stacks may include forming the TSV structures at the first interconnect level of the front end of line (FEOL) process. The method may include patterning and etching connecting vias into the backside of the wafer after thinning. One disadvantage of this method may be the difficulty of aligning a connecting via on the backside of a thinned wafer with a prior formed TSV structure. Misalignment may result in no connection to the TSV structure, or a limited connection to the TSV structure. Further, the diameter of a backside via structure employed to connect with a TSV may be smaller than the TSV. This may cause additional problems in clearing the sacrificial material from the prior formed TSV. A TSV/backside via structure may be more resistive if the sacrificial material is not sufficiently removed. Moreover, another disadvantage of the prior formed TSV is the cost of the photo procedure to pattern the backside of the wafer.

SUMMARY OF THE INVENTION

These and other problems are generally solved or circumvented, and technical advantages are generally achieved by a system, structure and method of forming a semiconductor substrate stack using a through substrate via (TSV) structure.

In accordance with an illustrative embodiment, an integrated circuit device is provided. The integrated circuit device includes a substrate having an active region formed therein, a via extending through the substrate, having a first termination substantially aligned with a bottom surface of the substrate and a second termination substantially aligned with a top surface of the substrate. A first conductive contact is electrically connected to the second termination of the via and electrically connected to a conductive interconnect layer. A second conductive contact is electrically connected to the conductive interconnect layer and the active region.

In accordance with another illustrative embodiment of the present invention, a semiconductor substrate is provided which includes a front-face, a backside, a bulk layer with a plurality of sub-bulk layers, an interconnect layer that includes a plurality of inter-metal dielectric layers sandwiched between conductive layers, a contact layer that is between the bulk layer and the interconnect layer, and a TSV structure commencing between the bulk layer and the contact layer and terminating at the backside of the substrate. The TSV structure is electrically coupled to the interconnect layer and the TSV structure is electrically coupled to a bonding pad on the backside.

In accordance with another illustrative embodiment of the present invention, a method manufacturing a semiconductor substrate structure is presented. The method includes etching a TSV structure into a front-face of a substrate before a FEOL contact process. The TSV structure is coated with a liner, filled with a sacrificial material, and provided with an etch stop layer (ESL). The method includes forming at least a first contact between the TSV structure and an interconnect layer and forming at least a second contact between an active region and an interconnect layer. A substrate backside is thinned and a bulk material is recessed to expose a bottom liner of the TSV structure. A hard mask passivation layer is disposed. The substrate backside is planarized exposing the sacrificial material. The sacrificial material is etched, and the ESL is removed. The TSV structure is then filled with a conducting material. A dielectric topside layer is deposited and a backside bonding pad is disposed. The backside bonding pad is electrically coupled to the TSV structure.

An advantage of an illustrative embodiment of the present invention is that the cost of the photolithography step to open vias on the backside of the substrate to contact the TSV structures is eliminated.

A further advantage of an illustrative embodiment of the present invention is the sacrificial material may be removed thoroughly, without misalignment and other associated disadvantages to the backside via pattern and etch process.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a front-to-front stacked semiconductor substrate system. The invention may also be applied, however, to other semiconductor substrate systems, such as single substrates, back-to-back bonded substrates, chip stacks, multiple substrate stacks, and the like. Embodiments may also have application in other through substrate via processes.

Figure 1:
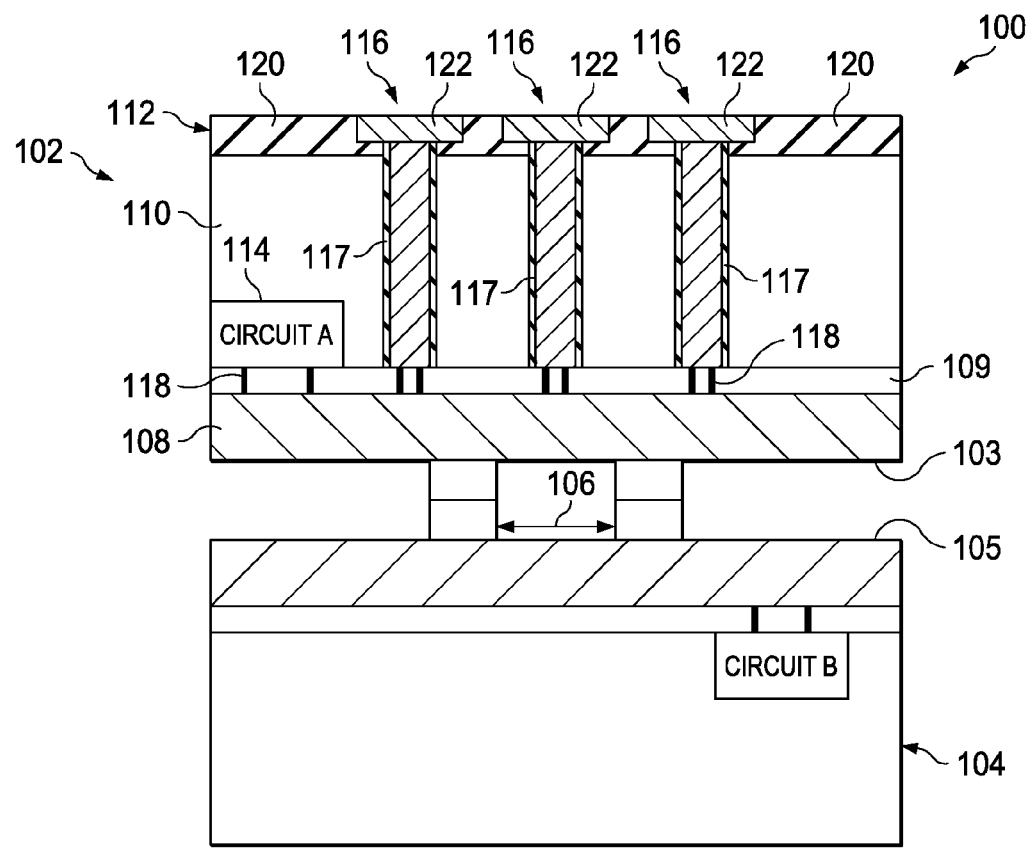
FIG. 1 is a cross sectional depiction of a semiconductor substrate stacking system, in accordance with an illustrative embodiment.

With reference now to FIG. 1, a system for stacking semiconductor substrates is shown. The term "substrate" herein, generally refers to a semiconductor substrate including a bulk layer 110 on which various layers and structures are formed. Silicon may be used or compound semiconductors, GaAs, InP, Si/Ge, or SiC, as examples, may be used in place of silicon. Example layers may include such layers as dielectric layers, doped layers and polysilicon layers. Example structures may include transistors, resistors, and/or capacitors, which may or may not be interconnected through an interconnect layer to additional active circuits.

System 100 shows substrate-A 102 inverted and bonded to substrate-B 104 at bonding joint 106. In an embodiment shown, front-face-A 103 of substrate-A 102 is bonded to front-face-B 105 of substrate-B 104 at bonding joint 106. Substrate-A 102 comprises interconnect layer 108, contact layer 109, bulk layer 110, and backside connection layer 112. Circuit-A 114 is also shown. Circuit-A 114 may extend from the upper layers of bulk layer 110 through contact layer 109 to interconnect layer 108.

Through substrate via (TSV) structures 116 are shown in substrate-A 102 and not in substrate-B 104. However, substrate-B 104 may have TSV structures in another embodiment. In yet another embodiment, multiple substrates may be stacked one on the other in front-to-front, front-to-back, and back-to-back configurations. TSV structures 116 may have lining 117 comprising a dielectric such as an oxide, nitride, or the like. TSV structures 116 are filled with a conductive material such as Al, Cu, other metals, alloys, doped polysilicon, combinations, and the like. Preferably, TSV structures 116 are filled with metal.

Semiconductor circuits, such as circuit-A 114, are manufactured by forming active regions in a bulk layer, such as bulk layer 110, depositing various insulating, conductive, and semiconductive layers over the substrate, and patterning them in sequential steps. The interconnect layer typically provides connections to underlying active regions and connections within and over the substrate. The interconnect layer includes one or more layers of metal interconnect having the conductive lines disposed within an insulating material. A contact layer, such as contact layer 109 is comprised of conductors disposed in dielectrics, which connect components in bulk layer 110 of substrate-A 114 to interconnect layer 108. The conductors in the contact layer may be any conducting material such as doped polysilicon, Al, Cu, W, alloys, combinations, and the like. Preferably, the contact material is W. Dielectrics in the contact layer may be oxides, nitrides, phosphosilicate glass (PSG), borophosphosilicate glass (BPSG), fluorinated silicate glass or fluorinated silicon oxide glass (FSG) or any electrically isolating materials.

TSV structures 116 are etched prior to contact layer 109 of circuit-A 114. Contacts 118 provide electrical coupling between the TSV structures 116 and interconnect layer 108. Backside connection layer 112 provides electrical interconnection between substrate-A 102 and outside systems, which may include other stacked substrates. Through bonding joint 106 backside connection layer 112 may also provide electrical interconnection between substrate-B 104 and outside systems. Backside connection layer 112 is comprised of a backside dielectric 120 and backside metal 122. Backside dielectric 120 may be, for example, a layer of SiN and a layer of an undoped silicon oxide glass (USG), or the like.

FIGS. 2A-2I are cross sectional depictions of a semiconductor substrate stacking system during selected process steps of an illustrative embodiment.

Figure 2A:
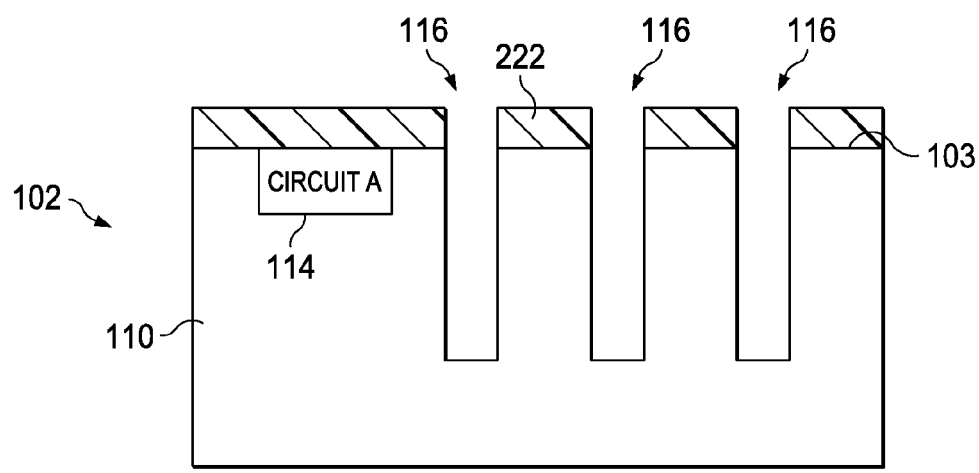
FIGS. 2A-2I are cross sectional depictions of a semiconductor substrate stacking system during selected process steps of an illustrative embodiment.

FIG. 2A shows substrate-A 102 with front-face 103 oriented up, as may be typical during circuit processing, and with TSV structures 116 oriented down into bulk layer 110 (note that substrate-A is shown oriented "flipped" relative to FIG. 1). Circuit-A 114 is shown prior to contact etch.

Bulk layer 110 may be patterned, for example, by depositing a photoresist 222 over the top surface of bulk layer 110. Using a reticle, having transparent regions and opaque regions, photoresist 222 or a hard mask may be patterned using techniques well known in the art. In an embodiment implementing a hard mask, the resulting TSV structure may then terminate substantially the thickness of the hard mask above the substrate, rather than substantially at the substrate. The TSV structures may be etched using a reactive-ion plasma process for example. A Bosch process, which is capable of achieving high aspect ratio structure, may be implemented in an embodiment. In an alternate embodiment a wet etch may be implemented. The TSV structures may range in depth from tens to hundreds of microns.

Figure 2B:
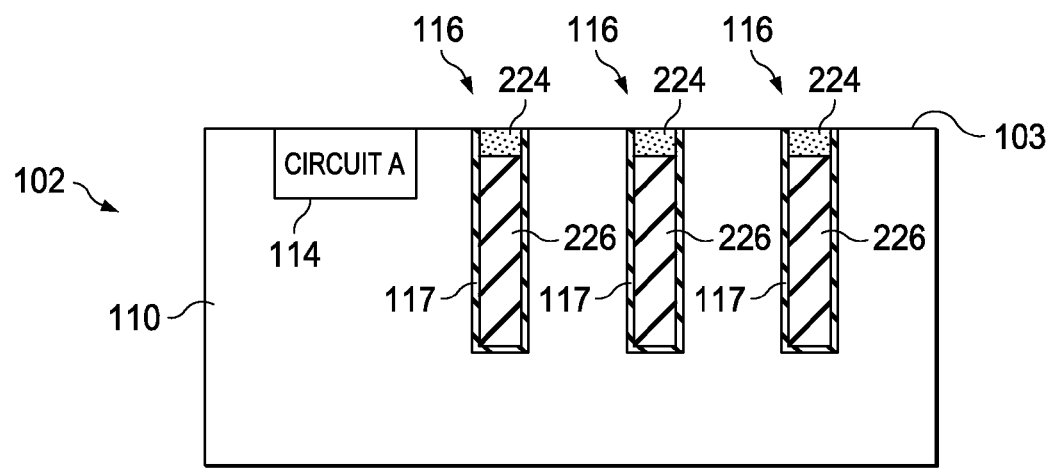

TSV structures 116, thus etched, are coated with a dielectric layer, such as $SiO_2$ or SiN to form liner 117, as shown in FIG. 2B. Liner 117 may be comprised of oxides, nitrides, combinations, or other dielectrics. Preferably, the liner is $SiO_2$, formed in a wet oxidation process.

Liner 117 may act as a passivation layer between bulk layer 110 and the subsequent metal conductor filled into TSV structures 116. An advantage of an illustrative embodiment is that high quality dielectrics may be more readily used in this step of the substrate processing.

TSV structures 116 are then filled with sacrificial material 226. The sacrificial material may be a nitride, an oxide, a doped or undoped polysilicon, or the like. One consideration of the choice of sacrificial material may be a high etch selectivity between liner 117 and subsequently deposited etch stop layer (ESL) 224. In the illustrative embodiment shown, undoped polysilicon is used to fill into the TSV structure. After deposition, a planarization process may be performed to remove any undoped polysilicon formed outside of the TSV structure.

Figure 2C:
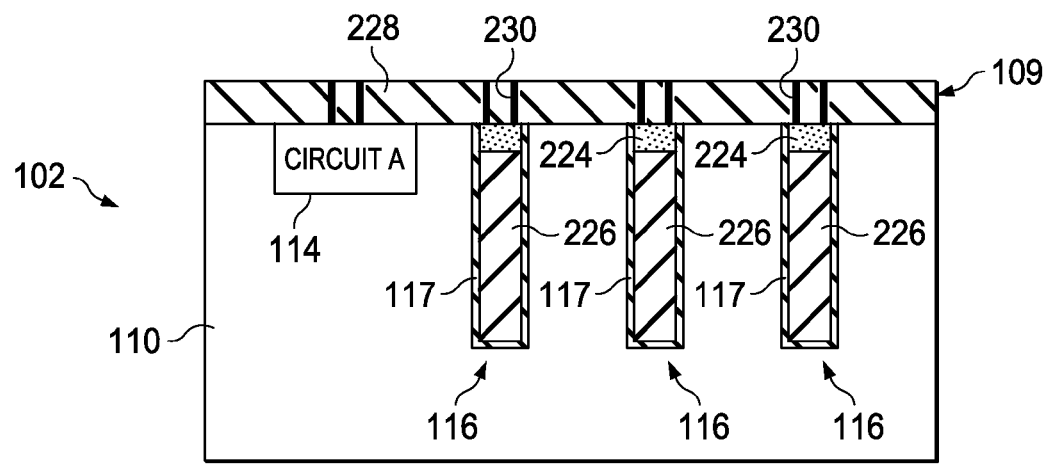
Figure 2D:
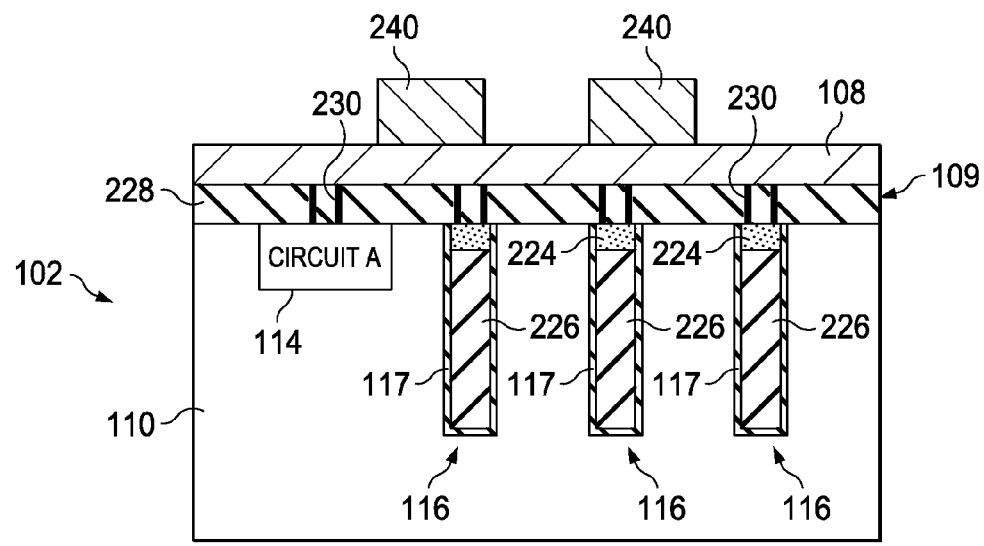
Figure 2E:
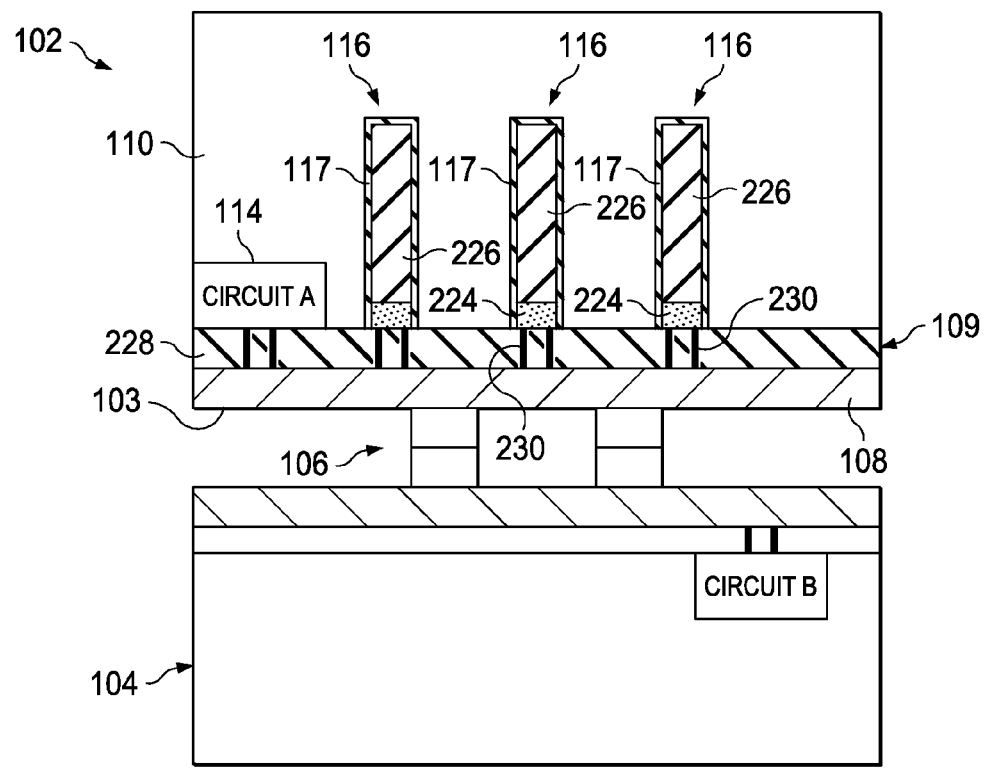
Figure 2F:
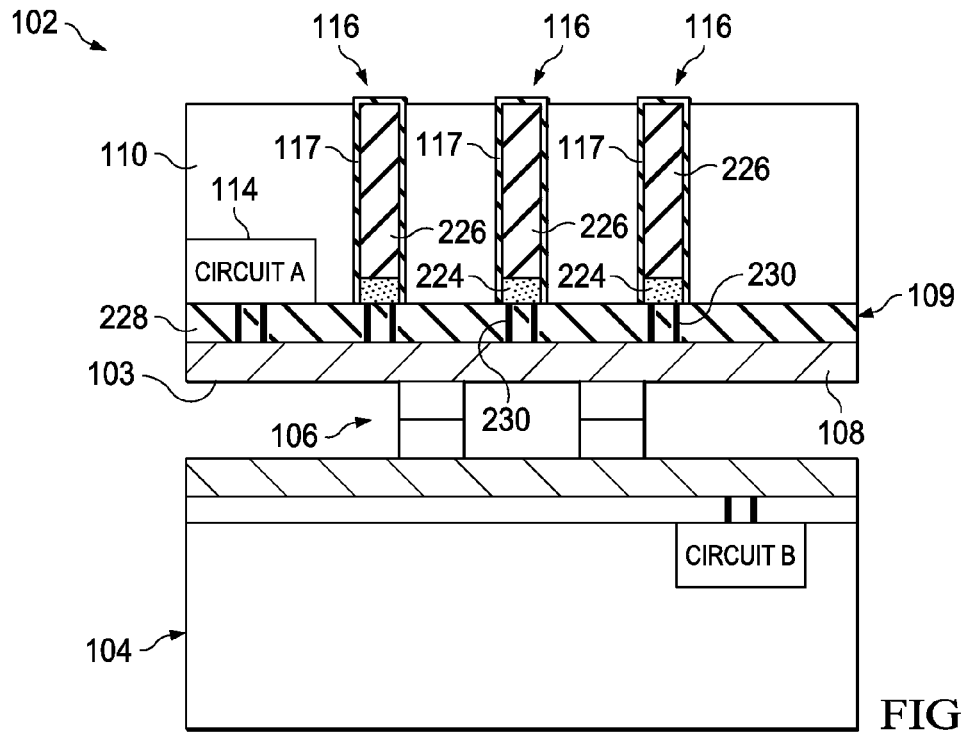
Figure 2G:
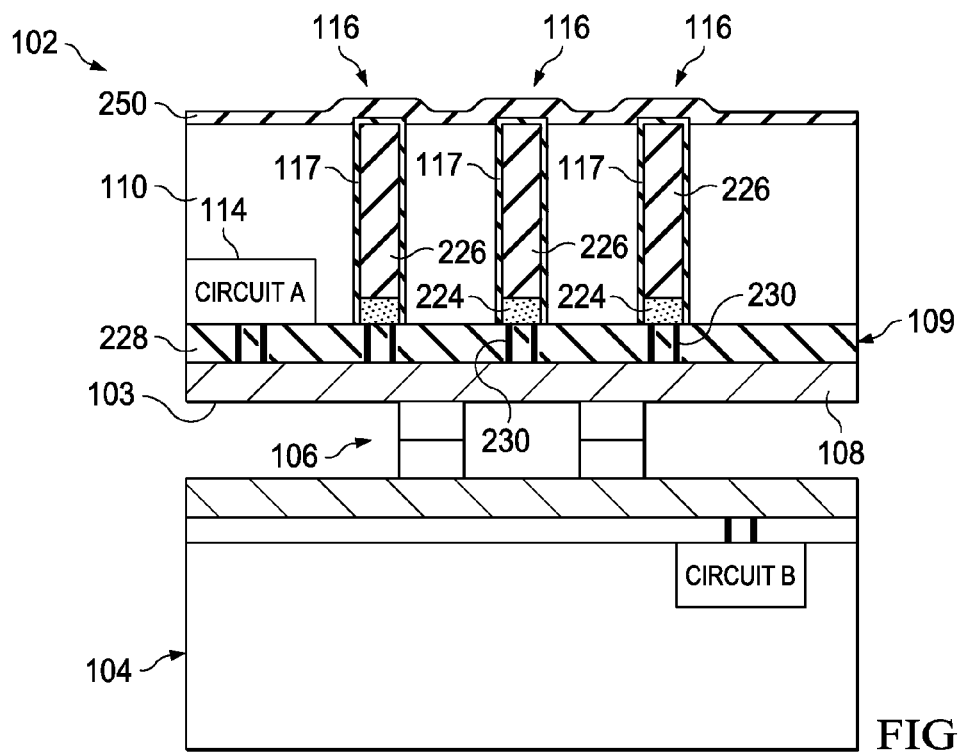
Figure 2H:
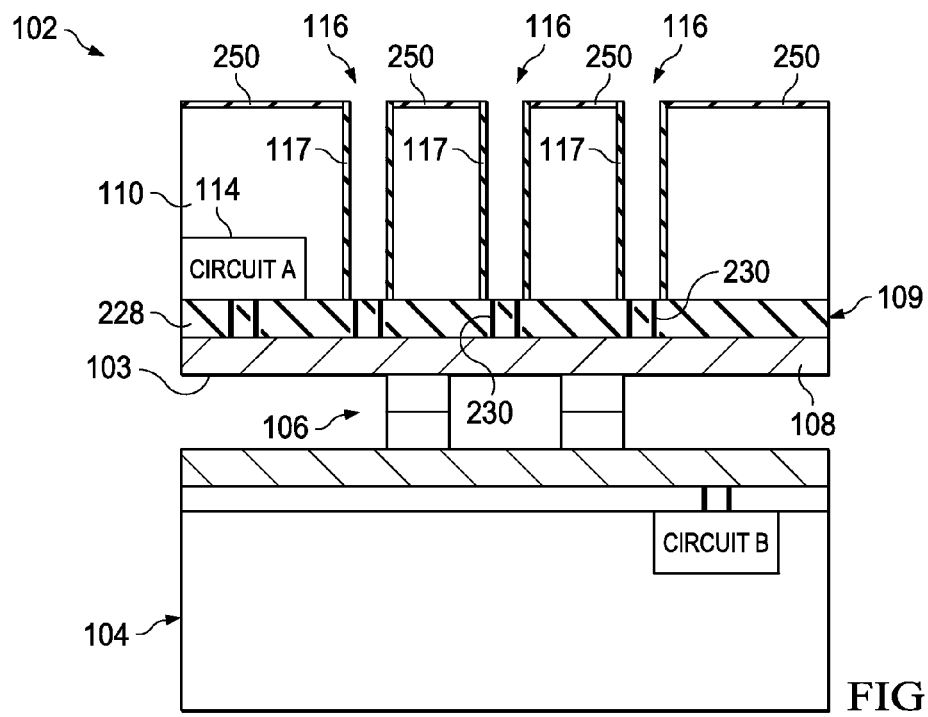

TSV structures 116 are then capped with a dielectric layer, which acts as an ESL 224 during the subsequent etch of sacrificial material 226 (described in FIG. 2H). ESL 224 may comprise oxide, nitride, other dielectrics, combinations, or the like. ESL 224 is preferably $SiO_2$. One consideration of the choice of ESL material may be a high etch selectivity between the ESL material and liner 117 plus the subsequently deposited hard mask (described further in FIG. 2G).

Turning to FIG. 2C, an insulating material layer 228 is then disposed on bulk layer 110. Insulating material layer 228 may be, for example, SiON, SiN, PSG, combinations, or the like. Insulating material layer 228 may be patterned and openings for contacts 230 may be etched. Contacts 230 may be comprised of metal, such as W, Al, Cu, combinations, or the like, filling the contact openings. Alternatively, contacts 230 may be formed of doped polysilicon or other sufficiently conductive material. Contacts 230 are formed in insulating material layer 228. Contact layer 109 comprises insulating material layer 228 and contacts 230. Note that some contacts 230 found in contact layer 109 may contact the TSV structures 116 and other contacts 230 found in contact layer 109 may contact circuit-A 114.

Turning now to FIG. 2D, interconnect layer 108 is shown. A single substrate may contain many active regions and/or functioning circuits. For example, bulk layer 110 may include one or more semiconductor elements, e.g. transistors, diodes, etc. (not shown) and circuit-A 114. Bulk layer 110 may also include other active components or circuits formed therein. At times, it is necessary to connect one circuit or device with another circuit or device that is not immediately adjacent to it. An interconnect layer, such as interconnect layer 108 may be used for this purpose.

Interconnect layer 108 may be comprised of a series of inter-metal dielectric (IMD) and conductive lines interconnected by vias (not shown). Interconnect layer 108 is further comprised of metal and inter-metal dielectrics, formed by disposing alternate layers of metal and inter-metal dielectrics. Conductive lines may comprise Cu, Al, W, other conductive material, or combinations thereof, as examples. One or more barrier layers and seed layers may be deposited prior to the deposition of the Cu, Al, W, other conductors, or combinations thereof, for example (not shown). The conductive lines may be disposed employing a damascene process, a dual damascene process, an etched conductive layer process, or the like. Different layers of the multilayered interconnect layer 108 may be comprised of different materials. Top metal 240 is formed for bonding substrate-A 102 to another substrate, or system. For example, top metal 240 may employed for use as a bonding joint, such as bonding joint 106, in FIG. 1. Top metal 240 may comprise Cu, Al, other metals, combinations, other conductors, and the like.

The insulating layers or inter-metal dielectrics described herein may comprise traditional insulating materials used for interconnect layers such as $SiO_2$, or alternatively may comprise low-κ materials. The low-κ material may comprise diamond-like carbon, such as Black Diamond™ by Applied Materials, Inc., phosphosilicate glass (PSG), borophosphosilicate glass (BPSG), fluorinated silicate glass or fluorinated silicon oxide glass (FSG), $SiO_xC_y$, Spin-On-Glass, Spin-On-Polymers, SILK™ by Dow Chemical, FLARE™ by Honeywell, LKD (low-κ dielectric) from JSR Micro, Inc., hydrogenated oxidized silicon carbon material (SiCOH), amorphous hydrogenated silicon (a-Si:H), $SiO_xN_y$, SiC, SiCO, SiCH, compounds thereof, composites thereof, and/or combinations thereof, as examples. In other applications, the insulating layers 218 may comprise a high dielectric constant material, having a dielectric constant of greater than about 4.0, for example. The insulating layers 218 may alternatively comprise a combination of one or more low-κ materials, high-κ material, $SiO_2$, SiN, or combinations, for example.

There may be one, or a plurality of metallization layers included in interconnect layer 108, for example (not shown).

FIG. 2E shows substrate-A 102 inverted and bonded to second substrate-B 104 employing bonding joint 106. Substrate-B 104 may be a second wafer, a second chip, a routing substrate, or the like.

After bonding to substrate-B 104, substrate-A 102 is thinned. The wafer may be thinned in a grinding, lapping, or polishing process. The wafer may be thinned to a range of several tens of microns, thus removing a portion of bulk layer 110.

Turning to FIG. 2F, the bulk layer 110 on the backside of substrate-A 102 is shown recessed to expose the bottom of liner 117. The recess process may be performed in a two-step process by, for example, a first CMP process and a second wet etch process. Alternatively, substrate 102 may be thinned and the backside of substrate-A 102 recessed in a single process step. The recess process may have a high etch selectivity between bulk layer 110 and liner 117.

Turning to FIG. 2G, passivation dielectric layer 250 is disposed. The passivation dielectric layer 250 serves as the hard mask for removing sacrificial material 226 from TSV structures 116 and serves as the passivation layer for the subsequent conductive material disposed in TSV structures 116. Passivation dielectric layer 250 may be a plasma enhanced USG material or other dielectric material.

The backside of substrate-A 102 is then planarized (again recall that the backside of substrate 102 is oriented up). A CMP process may be used for the planarization step. The CMP process may stop on liner 117, before exposing sacrificial material 226. A second wet or dry etch may be employed to expose sacrificial material 226. Alternatively sacrificial material 226 may be exposed in a one-step CMP or etch process. The etch of sacrificial material 226 may be implemented by a dry or wet method with the high selectivity between the sacrificial material 226 and the passivation dielectric layer 250.

The underlying bulk material is protected from the sacrificial material 226 etch by the passivation dielectric layer 250, which acts as a hard mask. Sacrificial material 226 etch stops at ESL 224. Next, ESL 224 is etched, exposing contact 230 for electrical interconnection.

As noted earlier the passivation dielectric layer 250 and the ESL material may be selected to have a high etch selectivity. Removal of ESL 224 allows access to contacts 230, which in turn electrically couples the TSV structures 116 to interconnect layer 108. The resulting structure is shown in FIG. 2H.

Figure 2I:
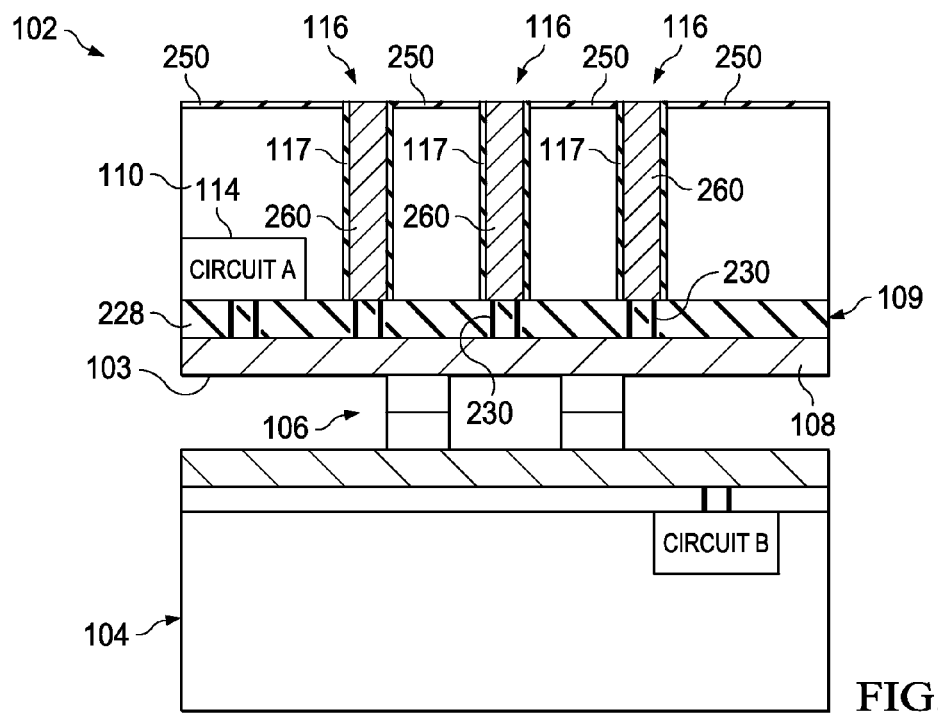

Turning to FIG. 2I, the TSV structures 116 are filled with conducting material 260. Metal, such as Al, Cu, alloys and the like may be sputtered, electro-plated, or screen-printed to fill TSV structures 116. Alternatively, other conductive materials may be used. Following the disposition of conducting material 260, substrate 102 may again be planarized by a CMP process.

The process is then completed by forming backside connection layer 112, as shown in FIG. 1. Backside connection layer 112 is comprised of a dielectric layer. For example, the dielectric layer may be formed by a SiN deposition, followed by a USG deposition. The dielectric layer may be patterned and etched. Backside metal 122 is formed by, for example, a damascene process or a patterning of a metal layer. Backside connection layer 112 may be comprised therefore of the SiN/USG dielectric layer and the backside metal 122. The substrate may then be bonded to further outside systems, using methods well known in the art. The resultant structure is shown in FIG. 1.

Figure 3:
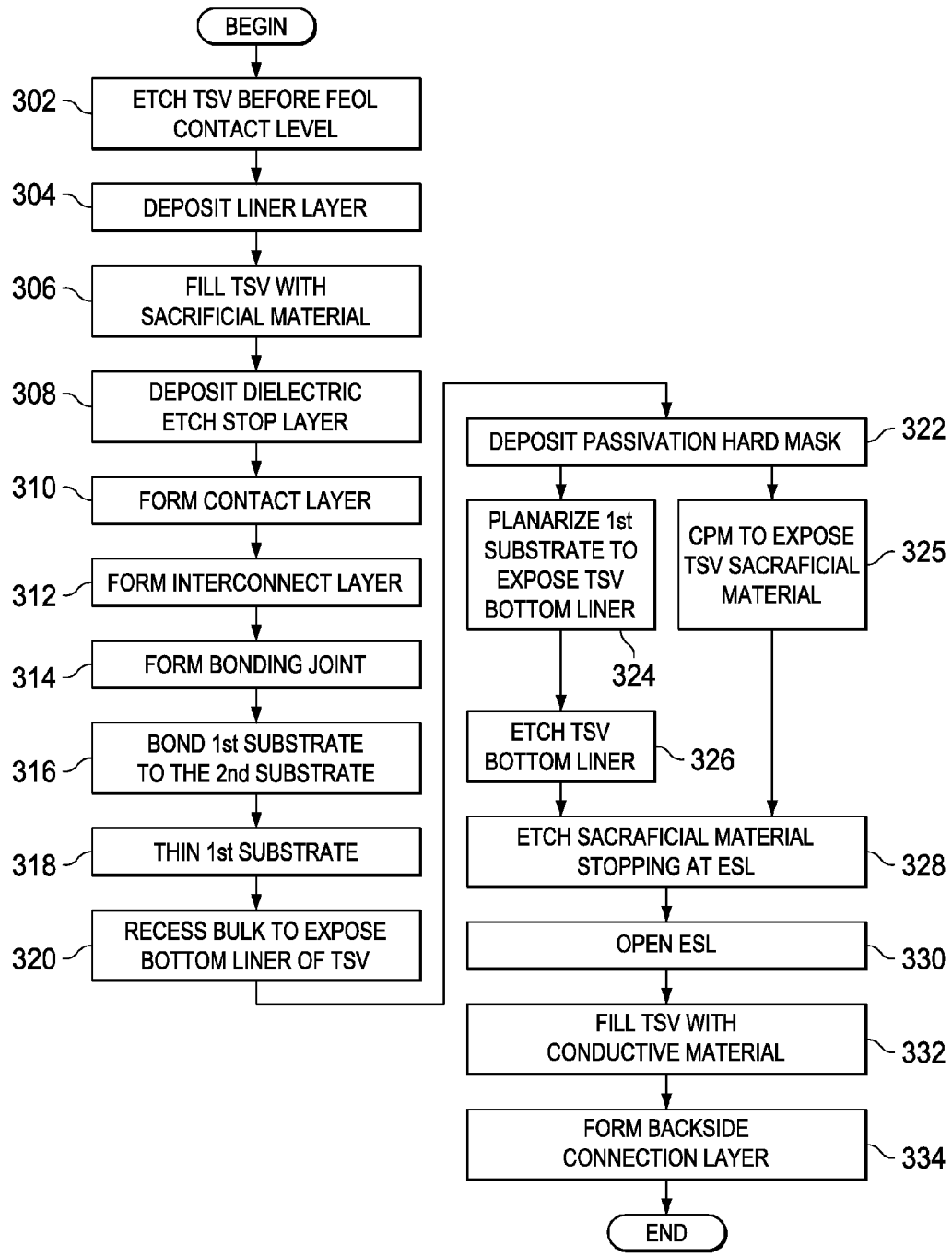
FIG. 3 is a flow chart of a method of forming a semiconductor substrate stacking system.

FIG. 3 is a flow chart of a method of forming a substrate within a semiconductor substrate stacking system. The process begins by etching TSV openings before the front end of line (FEOL) contact level (step 302) on a first substrate. The etched TSV is coated with a liner (step 304). The liner may act as a passivation layer providing a barrier between the substrate and the eventual conductive material in the finished TSV structure. The liner may be any dielectric, for example, a silicon nitride, a silicon oxide, or the like. An advantage of an illustrative embodiment is the quality of the dielectric that may be used for the liner at the pre-contact stage of processing. A high quality oxide may be used since no metals have been incorporated thus far in the process.

The TSV structure is then filled with a sacrificial material (step 306), forming a temporary plug in the TSV structure. The sacrificial material may be polysilicon, a dielectric, a polymer, any combination of these materials, or the like. A consideration in selecting a sacrificial material may be how the temporary material will be removed. A high selectivity between the sacrificial material and the subsequent hard mask may be desirable.

Following step 306, filling the TSV structure with sacrificial material, a dielectric etch stop layer (ESL) is disposed on top of the sacrificial material (step 308). The etch stop layer may be an oxide, nitride, other suitable dielectric, or the like. Following the ESL, the contact layer is formed (step 310). The contact layer comprises a dielectric layer or combination of dielectric layers, such as SiON, SiN, PSG and the like, and metal or conductive contacts, which may be W, Al, Cu, doped polysilicon, or the like.

Next, the interconnect layer is formed (step 312). The interconnect layer may be formed of Cu, Al, other metals, alloys, or conductive material combinations, sandwiched between inter-metal dielectric layers, which may be composed of FSG, USG, or the like. A top metal layer is formed which may be employed as a bonding joint (step 314).

The first substrate may then be inverted and bonded to a second substrate (step 316). In another embodiment, the second substrate may also have a TSV structure or structures and be stacked on a third substrate. In yet another embodiment, the first substrate may continue processing without bonding to another substrate.

The first substrate is then thinned (step 318). The thinning process may be done by mechanical cutting, wet or dry etching process.

The bulk material between the TSV structures is then recessed (step 320) to reveal the TSV structure liner (as shown in FIG. 2F). A hard mask is deposited (step 322) on the backside of the first substrate, covering the exposed TSV structure liner. The hard mask may be a dielectric and may be, for example, a plasma-enhanced USG. In addition to serving as a hard mask during the TSV structure sacrificial material removal, the hard mask serves as the passivation layer for the eventual TSV structure metal filling process.

The hard mask layer, disposed on the backside of the first substrate, is then planarized. The planarization may consist of, for example, a CMP process, which stops upon exposure of the liner (step 324). The planarized backside is then blanket etched to remove the exposed portion of the liner (step 326). Further, the blanket etch process may be a wet or dry etch. Alternatively, the CMP process may be extended to remove the exposed liner in one step (step 325). In either process, the sacrificial material in the TSV structure is exposed. A dry or wet etch may be used to remove the sacrificial material (328). The sacrificial material etch stops at the ESL layer. As noted above, a high selectivity between the hard mask and the ESL material may be desired.

The ESL is then etched (step 330), using either a wet or dry etch, as suitable. In an illustrative embodiment an anisotropic dry etch is implemented to limit the etch effect on liner 117.

The TSV structure is then filled with conductive material (step 332), for example, metals, metal alloys and the like. The filling process may be a sputter process, electro-plating process, a screen printing process, or the like. The metal surface of the backside of the first substrate is then planarized. A layer of SiN may be deposited followed by a dielectric layer of, for example, USG. The backside of the first substrate is then patterned and etched, to form openings or trenches to receive a further disposal of metal for the backside metal structures, thus forming backside connection layer (step 334). The substrate may be processed further with processes well known by those of ordinary skill in the art or the process may then end.

Although the illustrative embodiment and its advantages have been described in detail, it should be understood that various changes, substitutions, and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that layer compositions may be varied while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   etching a recess in a first side of a first substrate, the recess extending partially into the first substrate, the recess adjacent an active region in the first side of the first substrate;
   lining the recess with a dielectric material;
   filling the lined recess with a first material;
   forming contacts over the first side of the first substrate with at least one contact coupled to the active region and at least another contact over and aligned with the first material in the recess;
   forming an interconnect layer over the contacts and coupled to the at least one contact and the at least another contact;
   forming a bond pad over the interconnect layer;
   thinning a second side of the first substrate to expose the dielectric material;

removing the first material from the recess; and filling the recess with a conductive material, the conductive material in the recess being coupled to the at least another contact.

2. The method of claim 1, wherein the removing the first material from the recess removes substantially all of the first material from the recess and leaves the dielectric material lining the recess.

3. The method of claim 1, wherein filing the recess with a first material further comprises:

forming an etch stop layer in the recess, the etch stop layer being formed of a material selected from a group of materials consisting of Si, $Si_xC_y$, $Si_xN_y$, $Si_xC_y$, $Si_xO_y$, $Si_xO_yN_z$; and forming a second layer over the etch stop layer in the recess, the second layer being formed of a material selected from a group of materials consisting of a nitride, an oxide, a doped polysilicon, or an undoped polysilicon.

4. The method of claim 3, wherein the removing the first material from the recess further comprises:

performing a first etch process to remove the second layer from the recess, the first etch process exposing the etch stop layer; and performing a second etch process to remove the etch stop layer from the recess, the second etch process exposing the at least another contact.

5. The method of claim 1, wherein the at least another contact comprises a plurality of conductive contacts contacting the conductive material in the recess.

6. The method of claim 1, wherein the removing the first material from the recess further comprises:

forming a passivation layer over the second side of the first substrate and the exposed dielectric material lining the recess;

planarizing the passivation layer and the dielectric material to expose the first material in the recess; and selectively etching the first material from the recess.

7. The method of claim 1 further comprising:

bonding the first substrate to a second substrate using the bond pad.

8. A method comprising:

forming an active region in a first surface of a first substrate;

etching a recess from the first surface of the first substrate into the first substrate adjacent the active region;

lining the recess with a dielectric material;

filling the lined recess with a sacrificial material, the sacrificial material having a different material composition than the dielectric material;

forming contacts over the first surface of the first substrate, a first contact being coupled to the active region and a second contact over and aligned with the sacrificial material;

forming an interconnect layer over and coupled to the first and second contacts;

forming a bond pad over the interconnect layer, the bond pad being coupled to at least one of the first contact and the second contact;

bonding the first substrate to a second substrate using the bond pad;

thinning the first substrate from a second surface of the first substrate, the second surface being opposite the first surface, the thinning step exposing a portion of the dielectric material lining the recess;

removing the sacrificial material from the recess from the second surface of the first substrate; and filling the recess with a conductive material to form a through substrate via (TSV) in the first substrate, the second contact being directly coupled to the conductive material of the TSV.

9. The method of claim 8, wherein the removing the sacrificial material from the recess from the second surface of the first substrate removes substantially all of the sacrificial material from the recess and leaves the dielectric material lining the recess.

10. The method of claim 8, wherein the first contact comprises a plurality of conductive contacts contacting the active region, and the second contact comprises a plurality of conductive contacts contacting the conductive material of the TSV.

11. A method comprising:

etching a first side of a first substrate to create a recess adjacent an active region in the first side of the first substrate, at a step before contact etch;

forming a liner layer lining sidewalls and a bottom of the recess, the liner layer comprising a dielectric material;

filling the lined recess with a first material;

forming a contact layer over the first side of the first substrate, the contact layer comprising a plurality of contacts, a first contact of the plurality of contacts being coupled to the active region, a second contact of the plurality of contacts being aligned with the first material in the recess;

forming an interconnect layer over the contact layer, the interconnect layer being coupled to the first contact and the second contact;

forming a bond pad over the interconnect layer, the bond pad being coupled to at least one of the plurality of contacts;

thinning a second side of the first substrate to expose the line layer;

removing the first material from the recess; and filling the recess with a conductive material to form a through substrate via (TSV), the TSV coupled to the second contact.

12. The method of claim 11, wherein the filling comprises filling the lined recess with a sacrificial material selected from the group consisting of a nitride, an oxide, a doped polysilicon or an undoped polysilicon.

13. The method of claim 11, wherein a third contact of the plurality of contacts is coupled to the active region, and a fourth contact of the plurality of contacts is aligned with the first material in the recess.

14. The method of claim 11, further comprising depositing an etch stop layer in the recess and over the first material before the forming the contact layer.

15. The method of claim 14, further comprises removing the etch stop layer prior to filling the recess with the conductive material.

16. The method of claim 11, wherein the thinning comprises a chemical mechanical planarization (CMP) process followed by a wet etch process.

17. The method of claim 11, wherein the thinning is performed in a single processing step.

18. The method of claim 11, further comprising:

after the thinning and before the removing the first material, forming a passivation layer on the second side of the first substrate; and planarizing the passivation layer.

19. The method of claim 18, wherein the planarizing stops at the liner layer, wherein the method further comprises performing a wet etch process or a dry etch process to remove a portion of the liner layer such that the first material is exposed.

20. The method of claim 11, further comprises:
after the filling the recess, forming a connection layer over the second side of the first substrate, the connection layer having a conductive feature coupled to the TSV.

21. The method of claim 11 further comprising bonding the first substrate to a second substrate via the bond pad prior to the thinning.

* * * * *